US012716133B2

(12) United States Patent
Schachtner

(10) Patent No.: US 12,716,133 B2
(45) Date of Patent: Aug. 25, 2026

(54) PROCESS FOR WET-CHEMICAL FORMATION OF A STABLE TIN OXIDE LAYER FOR PRINTED CIRCUIT BOARDS

(71) Applicant: ATOTECH DEUTSCHLAND GMBH & Co. KG, Berlin (DE)

(72) Inventor: Bernhard Schachtner, Berlin (DE)

(73) Assignee: Atotech Deutschland GmbH & Co. KG, Berlin (DE)

( * ) Notice: Subject to any disclaimer, the term of this patent is extended or adjusted under 35 U.S.C. 154(b) by 0 days.

(21) Appl. No.: 18/862,425

(22) PCT Filed: May 5, 2023

(86) PCT No.: PCT/EP2023/061933

§ 371 (c)(1),
(2) Date: Nov. 1, 2024

(87) PCT Pub. No.: WO2023/217652

PCT Pub. Date: Nov. 16, 2023

(65) Prior Publication Data

US 2025/0340994 A1 Nov. 6, 2025

(30) Foreign Application Priority Data

May 9, 2022 (EP) .................................... 22172274

(51) Int. Cl.
*C23C 18/16* (2006.01)
*H05K 3/18* (2006.01)

(52) U.S. Cl.
CPC ...... *C23C 18/1637* (2013.01); *C23C 18/1689* (2013.01); *H05K 3/187* (2013.01); *H05K 2203/0315* (2013.01)

(58) Field of Classification Search
CPC ..... C23C 18/16; C23C 18/18; C23C 18/1844; C23C 18/28; C23C 18/31; C23C 18/48
See application file for complete search history.

(56) References Cited

U.S. PATENT DOCUMENTS

2003/0052157 A1* 3/2003 Wunderlich ........... H05K 3/243 228/215
2006/0035105 A1* 2/2006 Wessling ................ C23C 18/31 427/430.1
2006/0189141 A1* 8/2006 Mahlkow ............ C23C 18/1844 216/37
2008/0200360 A1* 8/2008 Beck .................... C11D 7/3218 510/175
2009/0081370 A1* 3/2009 Lowinski ............... H05K 3/244 427/307
2013/0220677 A1* 8/2013 Amou ....................... B32B 3/08 428/458
2015/0010773 A1* 1/2015 Sauer ..................... C25D 11/34 205/140
2017/0033372 A1* 2/2017 Yano ........................ C25D 3/46

FOREIGN PATENT DOCUMENTS

CN 105624681 A * 6/2016 ................ C23F 1/40
EP 0726968 B1 11/1999
EP 2867390 A1 5/2015
WO 2007025675 A1 3/2007
WO 2007030672 A2 3/2007
WO 2012095334 A1 7/2012
WO WO-2020017524 A1 * 1/2020 ............... H05K 3/38

OTHER PUBLICATIONS

Written Opinion of the Int'l Searching Authority for PCT/EP2023/061933, Nov. 16, 2023, 6 pages. (Year: 2023).*
USP Technologies, "What are H2O2 stabilizers and will they affect my application," https://web.archive.org/web/20210411030200/https://usptechnologies.com/what-are-h2o2-stabilizers-and-will-they-affect-my-application/ (Apr. 11, 2021). (Year: 2021).*
International Search Report and Written Opinion issued in PCT counterpart application No. PCT/EP2023/061933 dated Aug. 23, 2023 (12 pages).

* cited by examiner

*Primary Examiner* — William P Fletcher, III

(57) ABSTRACT

A process for treating a tin or tin alloy layer onto metal surfaces, preferred copper surfaces, comprising the steps of
(i) providing a metal surface, preferred a copper surface,
(ii) contacting the metal surface, preferred the copper surface, with a tin or tin alloy plating bath; and
(iii) oxidizing the tin or tin alloy layer obtained by step (ii).

17 Claims, 4 Drawing Sheets a)

b)

PROCESS FOR WET-CHEMICAL FORMATION OF A STABLE TIN OXIDE LAYER FOR PRINTED CIRCUIT BOARDS

This application is a national phase of International Application No. PCT/EP2023/061933 filed 5 May 2023, which claims priority to European Patent Application No. 22172274.7 filed 9 May 2022, each of which is hereby incorporated herein by reference in its entirety.

FIELD OF THE INVENTION

The invention relates to a process comprising a wet-chemical oxidation step of tin layers as top layers. The process preferably serves to produce electric circuit carriers, more specifically to produce printed circuit boards, in particular to produce contacts on circuit carriers, such as edge connector contacts and push button contacts on printed circuit boards.

BACKGROUND OF THE INVENTION

During manufacturing of electric circuit carriers, organic and/or metallic layers are applied onto the copper surfaces of the base material. These layers may perform different functions. The organic layers may for example be used to structure the copper surfaces in the subsequent processes. For this purpose, photoresists are applied onto the copper surfaces so as to completely cover them. Thereafter, the layers may be partially exposed to light using a special photomask which images the desired line structures on the photoresist. Thereafter, the imaged structures are developed with corresponding chemicals. Depending on the type of photoresist, which may be negative or positive, either the areas that have been exposed to light or those that have not are removed due to developing so that areas of the copper layer located there beneath are exposed. These areas may then be selectively etched or plated with copper or other metals using an electroless, a chemical or an electrochemical method.

If the metal layers are partially etched or deposited as described, the circuit carriers obtained have certain line structures. To build up complex structures, the method steps may be repeated. Individual layers are compacted together to form multilayer circuits.

In order to allow for electronic component mounting on the circuit carriers provided with the line structures, additional layers such as gold, silver, tin, nickel layers, are for example deposited next, using an electroless, a chemical or an electrochemical method, to form the surface top layer while using a solder resist. On the one side, these surface top layers serve to form solderable surface areas needed to mount the components. On the other side, gold surface areas are also suited for bonding housed and unhoused semiconductor components.

WO 2012/095334 discloses tin plating baths.

These surface top layers moreover also serve as protective layers intended to prevent the copper surfaces from oxidizing and to preserve their solderability. These top layers are necessary since the manufacturing of the circuit carrier and its further processing, e.g., the mounting of components thereon, usually will not take place on the same manufacturing site, so that further processing will only occur at a later stage.

Gold and silver layers are for example also formed as surface top layers for manufacturing detachable electric contacts, for example plug connectors for plugging the circuit carrier by inserting them into contact sockets and contact areas for manufacturing push buttons.

Once the circuit carrier has been completed, i.e., after the surface top layer has been applied, the circuit carriers are rinsed thoroughly once more, before they are dried and then stored or subjected to further processing, in order to clean them from any ionic contaminants originating from the various method steps and more specifically being caused by the deposition method for producing the surface top layers.

Such a cleaning is e.g. disclosed in WO 2007/025675.

Due to very high quality demands in electronics industry impurities, e.g. atmospheric impurities, must be avoided. Therefore, nowadays, products, in particular circuit carriers, with freshly produced tin layers are immediately packed under vacuum.

However, it has been found that these metallic tin layers show stability problems in final assembly processes. There is a tendency towards dewetting which in extreme cases leads to sphere formation and/or copper diffusion from the underlying copper layer through the tin layer to the surface. This effect becomes more pronounced with increasing temperature. In modern leadfree soldering reflow processes with peak temperatures higher than the melting point of pure tin the described unwanted dewetting is a continuous challenge.

Another problem is that, in automated optical inspection (AOI), with pure tin metal surfaces mark points are not correctly recognized. This has, at least, two reasons. One is the shininess of the tin metal layers. The other one is an undefined optical character of the surfaces such as e.g. a PCB surface. The undefined optical character can be assigned to an, at least, partial dewetting.

OBJECTIVE OF THE PRESENT INVENTION

It is therefore an object of the invention to find a process which minimizes or even avoids the above problems.

It is a further object of the invention to find a process which does not negatively influence the tin layer, e.g. by chemical contamination, in particular ionic contamination. As a control measure, the conductance of the medium in last rinsing step should remain below 10 μS/cm.

It is a further object of the invention to find a process which is cost efficient and easy to manipulate.

SUMMARY OF THE INVENTION

Above-mentioned objectives are solved by the inventive process according to claim 1. Preferred embodiments of the present invention can be found in the dependent claims.

The inventive process comprises a wet-chemical oxidation step of a tin layer. The advantage is that such a step can be easily integrated into existing processes.

DETAILED DESCRIPTION OF THE INVENTION

Figure 1:
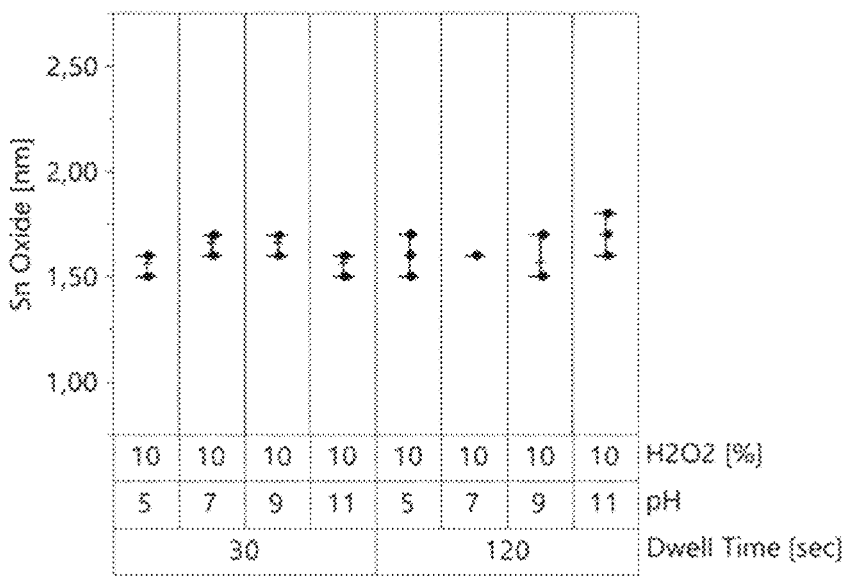
FIG. 1 shows the thickness of tin oxide layers on tin depending on different parameters: (a) concentration of oxidising agent $H_2O_2$, pH and dwell time (at a constant temperature); (b) concentration of oxidising agent $H_2O_2$, pH, Ionix and dwell time (at a constant pH).
Figure 1:
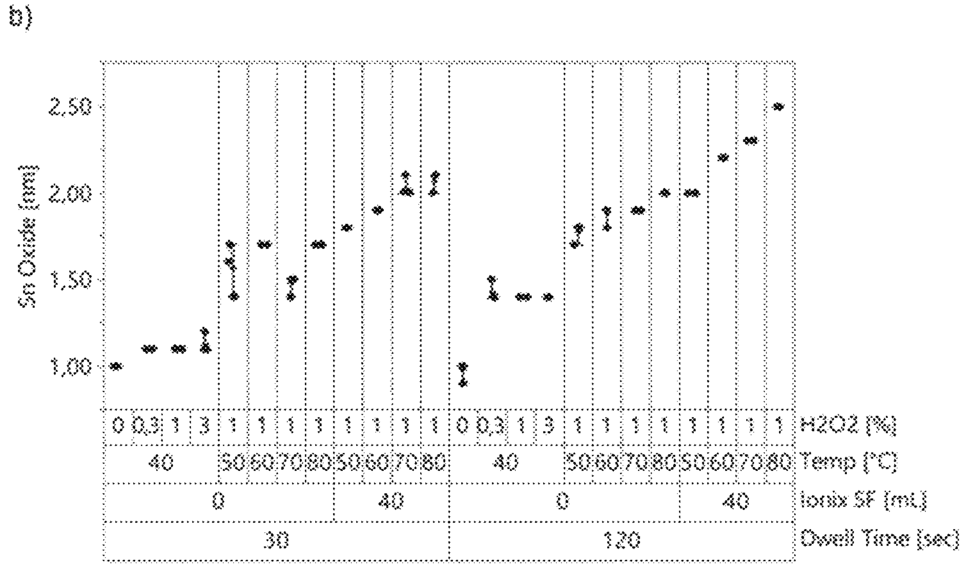

Percentages throughout this specification are weight-percentages (wt.-%) unless stated otherwise. One exception are yields which are given as percentage of the theoretical yield. Concentrations given in this specification refer to the volume of the entire solutions unless stated otherwise.

The process of the invention for treating a tin or tin alloy layer onto metal surfaces, preferred copper surfaces, is characterized by the following process steps:

(i) Providing a metal surface, preferred a copper surface,
(ii) Contacting the metal surface, preferred the copper surface, with a tin or tin alloy plating bath; and
(iii) Oxidizing the tin or tin alloy layer obtained by step (ii).

Step (i)—Providing a Metal Surface, Preferred a Copper Surface

In principle, any metal surface can be used for the process of the invention. Preferred, the metal of the metal surface is selected from the group consisting of nickel, gold, palladium, copper and silver. Particularly preferred the metal surface is a copper surface.

Step (ii)—Contacting the Metal Surface, Preferred the Copper Surface, With a Tin or Tin Alloy Plating Bath The contacting of the metal surface with a tin or tin alloy plating bath is used as a deposition method in order to deposit tin or tin alloy on the metal surface.

In principle, any of the methods known to the skilled person can be used. These include electroless, chemical and electrochemical methods. Preferred is a process wherein the tin or tin alloy plating bath is an immersion plating bath. In an alternative preferred process the tin or tin alloy plating bath is an electroless plating bath.

The tin or tin alloy plating bath can additionally comprise at least one stabilizing agent.

The at least one stabilizing agent can be selected from stannates, organic acids, inorganic acids and combinations thereof.

Examples of stannates are potassium stannate or sodium stannate.

Examples of the organic acid include organic sulfonic acids, aliphatic carboxylic acids, oxycarboxylic acids, aminocarboxylic acids, and the like.

Among the organic acids, organic sulfonic acids are excellent in that waste water treatment is easy, solubility of metal salts is high, high-speed plating is possible, electrical conductivity is high, and the like.

Examples of the organic sulfonic acid include methanesulfonic acid, ethanesulfonic acid, 1-propanesulfonic acid, 2-propanesulfonic acid, 1-butanesulfonic acid, 2-butanesulfonic acid, pentanesulfonic acid, hexanesulfonic acid, decanesulfonic acid, Alkanesulfonic acids such as dodecanesulfonic acid, 2-hydroxyethane-1-sulfonic acid, 2-hydroxypropane-1-sulfonic acid (2-propanolsulfonic acid), 2-hydroxybutane-1-sulfonic acid, 2-hydrox-ypentane-1-sulfonic acid, and the like; Alkanolsulfonic acids such as 1-hydroxypropane-2-sulfonic acid, 3-hydroxypropane-1-sulfonic acid, 4-hydroxybutane-1-sulfonic acid, 2-hydroxyhexane-1-sulfonic acid, 2-hydroxydecane-1-sulfonic acid, 2-hydroxydodecane-1-sulfonic acid; 1-naphthalenesulfonic acid, 2-naphthalenesulfonic acid, toluenesulfonic acid, xylene sulfonic acid, p-phenolsulfonic acid, cresol sulfonic acid, sulfosalicylic acid, nitrobenzenesulfonic acid, sulfobenzoic acid, diphenylamine-4-sulfonic acid, and the like.

Furthermore, the aliphatic carboxylic acid, oxycarboxylic acid, aminocarboxylic acid, and the like described above are effective in preventing hydrolysis of the metal salt in the range of about pH1 to 10.

Generally, carboxylic acids having from 1 to 6 carbons can be used as the aliphatic carboxylic acid, and specific examples thereof include acetic acid, propionic acid, butyric acid, sulfosuccinic acid, trifluoroacetic acid, and the like.

Examples of the oxycarboxylic acid include lactic acid, citric acid, gluconic acid, tartaric acid, malic acid, and the like.

The aminocarboxylic acids include ethylenediaminetetraacetic acid (EDTA), diethylenetriaminepentaacetic acid (DTPA), nitrilotriacetic acid (NTA), iminodiacetic acid (IDA), iminodipropionic acid (IDP); Hydroxyethylethylenediamine triacetic acid (HEDTA), triethylenetetraaminehexaacetic acid (TTHA), glycine, alanine, N-methylglycine, lysine, glutamic acid, aspartic acid, and the like.

Examples of the inorganic acid include phosphonic acid, phosphoric acid, sulfuric acid, hydrochloric acid, boric acid, fluorohydrofluoric acid, silicic acid, sulfamic acid, and the like.

Various known additives such as surfactants, complexing agents, stabilizers, brighteners, semi-brighteners, pH adjusters, buffers, and the like can be appropriately mixed with the tin plating bath of step (ii) of the process according to the purpose.

Step (iii)—Oxidizing the Tin or Tin Alloy Layer Obtained by Step (ii)

The process step (iii) is performed by contacting the tin or tin alloy layer obtained by step (ii) with a composition comprising at least one solvent and at least one oxidizing agent.

Preferred, the at least one solvent comprises water in an amount of 50 vol % or more. The rest is selected from the group consisting of water-miscible organic solvents. A preferred water-miscible organic solvent is ethanol.

More preferred the at least one solvent is water.

The at least one oxidizing agent is selected from non-decomposable and decomposable oxidizing agents, such as peroxides such as hydrogen peroxide, metal peroxides like sodium peroxide, potassium peroxide; metal superoxides such as potassium superoxide; copper ions and ferric ions.

However, ionic species have a negative impact on the conductivity and are less preferred.

Preferred are decomposable oxidizing agents, more preferred the at least one oxidizing agent comprises hydrogen peroxide, most preferred the at least one oxidizing agent is hydrogen peroxide.

To prevent decomposition of peroxides, other additional compounds such as p-phenolsulphonic acid, phosphoric acid, stannate and/or organic acids as well as respective derivatives, such as oxalic acid and respective esters, α-keto carboxylic esters or aldehyde carboxylic esters can be added.

The concentration of the at least one oxidizing agent in the composition typically ranges from about 0.1 to about 20 g/l, preferred from about 0.2 to about 10 g/l, more preferred from about 0.3 to about 5 g/l, even more preferred from about 0.5 to about 3 g/l.

The pH of the composition typically ranges from about 3 to about 12. Preferred, the pH of the composition ranges from about 3.5 to about 10. More preferred, the pH of the composition ranges from about 4.0 to about 8.0. Even more preferred, the pH of the composition ranges from about 4.5 to about 6.5. Most preferred, the pH of the composition ranges from about 4.5 to about 5.5. The pH can be adjusted by any chemical compounds known to the skilled person. However, non ionic compounds are preferred. Particularly preferred is ammonia.

The dwell time of step (iii) typically is from about 0.1 min to about 5 min, preferred from about 0.2 min to about 2 min, more preferred from about 0.3 min to about 1.5 min, even more preferred from about 0.4 min to about 1 min.

The temperature in step (iii) typically is higher than 40° C., preferred the temperature is from about 40° C. to about 90° C., more preferred from about 50° C. to about 80° C., even more preferred from about 60° C. to about 75° C.

In a preferred embodiment, the process of the invention is used in the production of electric circuit carriers in vertical and/or horizontal lines.

In a preferred embodiment, the process according to any one of the preceding embodiments in the production of electric contacts on electric circuit carriers.

The process typically further comprises rinsing the tin or tin alloy layer at least once with deionized water before and/or after step (iii).

In a preferred embodiment, the process further comprises a step (ii-a) between step (ii) and step (iii), wherein step (ii-a) comprises treating the tin or tin alloy layer with an aqueous solution, the solution containing:

a) at least one first compound selected from the group comprising ethanolamine compounds and the salts thereof;
b) at least one second compound selected from the group comprising alcoholic solvents, and
c) optionally, at least one third compound selected from the group comprising guanidine compounds and salts thereof.

It has been found earlier that this step as an overall positive impact in order to decrease the conductivity. It is assumed that this step works as a surface cleaner and, at the same time, as a sweller.

EMBODIMENTS

A. A process for treating a tin or tin alloy layer onto metal surfaces, preferred copper surfaces, comprising the steps of
   (i) Providing a metal surface, preferred a copper surface,
   (ii) Contacting the metal surface, preferred the copper surface, with a tin or tin alloy plating bath; and
   (iii) Oxidizing the tin or tin alloy layer obtained by step (ii).

B. The process according to embodiment A wherein the tin or tin alloy plating bath is an immersion plating bath.

C. The process according to embodiment A or embodiment B wherein step (iii) is performed by contacting the tin or tin alloy layer obtained by step (ii) with a composition comprising at least one solvent and at least one oxidizing agent, wherein preferred the at least one solvent comprises water, more preferred the at least one solvent is water.

D. The process according to embodiment C wherein the composition additionally comprises at least one stabilizing agent.

E. The process according to embodiment C or embodiment D wherein the at least one oxidizing agent is selected from non-decomposable and decomposable oxidizing agents, preferred from decomposable oxidizing agents, more preferred the at least one oxidizing agent comprises hydrogen peroxide, most preferred the at least one oxidizing agent is hydrogen peroxide.

F. The process according to any one of the preceding embodiments C to E, characterized in that the concentration of the at least one oxidizing agent in the composition ranges from about 0.1 to about 20 g/l, preferred from about 0.2 to about 10 g/l, more preferred from about 0.3 to about 5 g/l, even more preferred from about 0.5 to about 3 g/l.

G. The process according to any one of the preceding embodiments C to F, characterized in that the pH of the composition ranges from about 3 to about 12, preferred, from about 3.5 to about 10, more preferred, from about 4.0 to about 8.0, even more preferred, from about 4.5 to about 6.5, even more preferred, from about 4.5 to about 5.5.

H. The process according to any one of the preceding embodiments, characterized in that the dwell time of step (iii) is from about 0.1 min to about 5 min, preferred from about 0.2 min to about 2 min, more preferred from about 0.3 min to about 1.5 min, even more preferred from about 0.4 min to about 1 min.

I. The process according to any one of the preceding embodiments, characterized in that the temperature in step (iii) is higher than 40° C., preferred the temperature is from about 40° C. to about 90° C., more preferred from about 50° C. to about 80° C., even more preferred from about 60° C. to about 75° C.

J. The process according to any one of the preceding embodiments in the production of electric circuit carriers in vertical and/or horizontal lines.

K. The process according to any one of the preceding embodiments in the production of electric contacts on electric circuit carriers.

L. The process according to any one of the preceding embodiments, characterized in that the process further comprises rinsing the tin or tin alloy layer at least once with deionized water before and/or after step (iii).

M. The process according to any one of the preceding embodiments, characterized in that the process further comprises a step (ii-a) between step (ii) and step (iii), wherein step (ii-a) comprises treating the tin or tin alloy layer with an aqueous solution, the solution containing:

a) at least one first compound selected from the group comprising ethanolamine compounds and the salts thereof;
b) at least one second compound selected from the group comprising alcoholic solvents, and
c) optionally, at least one third compound selected from the group comprising guanidine compounds and salts thereof.

N. The process according to any one of the embodiments A to M, characterized in that the surface tension of the tin oxide layer after dry aging at 90° C. for 14 hours has a value of 70 mN/m or higher, preferred 75 mN/m or higher, more preferred 80 mN/m or higher, even more preferred 85 mN/m or higher.

O. The process according to any one of the embodiments A to M, characterized in that the surface tension of the tin oxide layer after dry aging at 90° C. for 14 hours has a value of from 70 mN/m to 100 mN/m; more preferred of from 80 mN/m to 95 mN/m, even more preferred of from 85 mN/m to 95 mN.

P. An article comprising a metal layer, preferred a copper layer, a tin layer and a tin oxide layer, characterized in that the tin oxide layer has as thickness of from 1 to 3 nm as determined by SERA.

Q. An article according to embodiment P characterized in that the surface tension of the tin oxide layer after dry aging at 90° C. for 14 hours has a value of 70 mN/m or higher, preferred 75 mN/m or higher, more preferred 80 mN/m or higher, even more preferred 85 mN/m or higher.

R. An article according to embodiment P characterized in that the surface tension of the tin oxide layer after dry aging at 90° C. for 14 hours has a value of from 70 mN/m to 100 mN/m; more preferred of from 80 mN/m to 95 mN/m, even more preferred of from 85 mN/m to 95 mN.

The following non-limiting examples further illustrate the present invention.

EXAMPLES

SERA measurement: Dry specimen placed on SERA® QC-100. Using Bor Acid/Borat buffer with pH-value of around 9 and current density of −30 μA/cm2 the Sn(II)Oxide layer will be measured by coulometry with a sealing opening diameter of 1.6 mm. The result will be validated by the current accumulated between the reduction voltage of −0.8 to −1.1 V.

Shiny tin measurement: Dry specimen was aged in a reflow oven with reduced oxygen concentration of around 100 ppm and a reflow profile for Senju M31-GRN360-K-V solder paste (peak 245° C.). After aging, a flatbed scanner was used to create a digital picture of the specimen. Because of typical angle of around 45° in a flatbed scanner between the light source and the RGB-sensors only diffuse reflected light can be detected by the RGB-sensor. Every total reflected light (mirror) on the tin surface will not reach the RGB-sensor. Depending to the optical character of the tin surface more or less light reaches the RGB-sensor. Normal tin surface creates a bright white color. Shiny tin detected as dark areas with much less brightness.

Surface Tension Measurement: Contact angle measuring device OCA15—Measurement using water and Young's equation: $\cos \Theta=(\sigma_s-\sigma_{LS})/\sigma_L$ with $\sigma_L$=72.85 mN/m and $\sigma_{LS}$=12.3 mN/m; drop size: 1 μL; measuring time: 3 sec. Alternatively, commercially available water/ethanol test inks can be used in a range of 30-72 mN/m.

Example 1

Printed circuit boards with solder resist mask (Taiyo PSR-4000 AM03TS) were treated with a tin deposition method according to Table 1 and a layer of immersion tin of 1 μm thick was applied. The tin deposition bath contained tin (II) methanesulfonate, methane sulfonic acid and thiourea.

After deposition of tin, different parameters were applied in the post dip step and the samples were investigated by SERA. The parameters and the respective tin oxide thicknesses are shown in FIG. 1.

TABLE 1

| Process sequence | | | | | | |
|---|---|---|---|---|---|---|
| Method step | Chemical | T [° C.] | Time [min] | Comp. Process C-1 (*) | Comp. Process C-2 (**) | Process acc. to the invention (P) |
| Cleaner | Pro Select SF | 40 | 1 | X | X | X |
| Rinse | DI Water | RT | 1 | X | X | X |
| Rinse | DI Water | RT | 1 | X | X | X |
| Etch | Micro Etch SF | RT | 5 | X | X | X |
| Rinse | DI Water | RT | 1 | X | X | X |
| Rinse | DI Water | RT | 1 | X | X | X |
| Conditioner | Stanna Dip V | RT | 1 | X | X | X |
| Tin Bath | Stannatech 2000 V bath | 70 | 12 | X | X | X |
| Rinse | DI Water | RT | 1 | X | X | X |
| Rinse | DI Water | RT | 1 | X | X | X |
| Ionix | Ionix SF 40 mL/L | 70 | 1 | — | X | X |
| Rinse | DI Water | RT | 1 | X | X | X |
| Post Dip | Tin PD 2020 | RT | 1 | — | — | X |
| Rinse | DI Water | RT | 1 | X | X | X |
| Hot rinse | DI Water | 65 | 1 | X | X | X |
| Airknife | Cold Air | | | X | X | X |
| Dryer | | 65 | 1 | X | X | X |

DI water: deionized water

RT: room temperature (*) process similar to 60243

(**) process similar to 60243 (comparative example)

Example 2

Printed circuit boards with solder resist mask (Taiyo PSR-4000 AM03TS) were treated with a tin deposition method according to Table 1 and a layer of immersion tin of 1 μm thick was applied. The tin deposition bath contained tin (II) methanesulfonate, methane sulfonic acid and thiourea.

Figure 2:
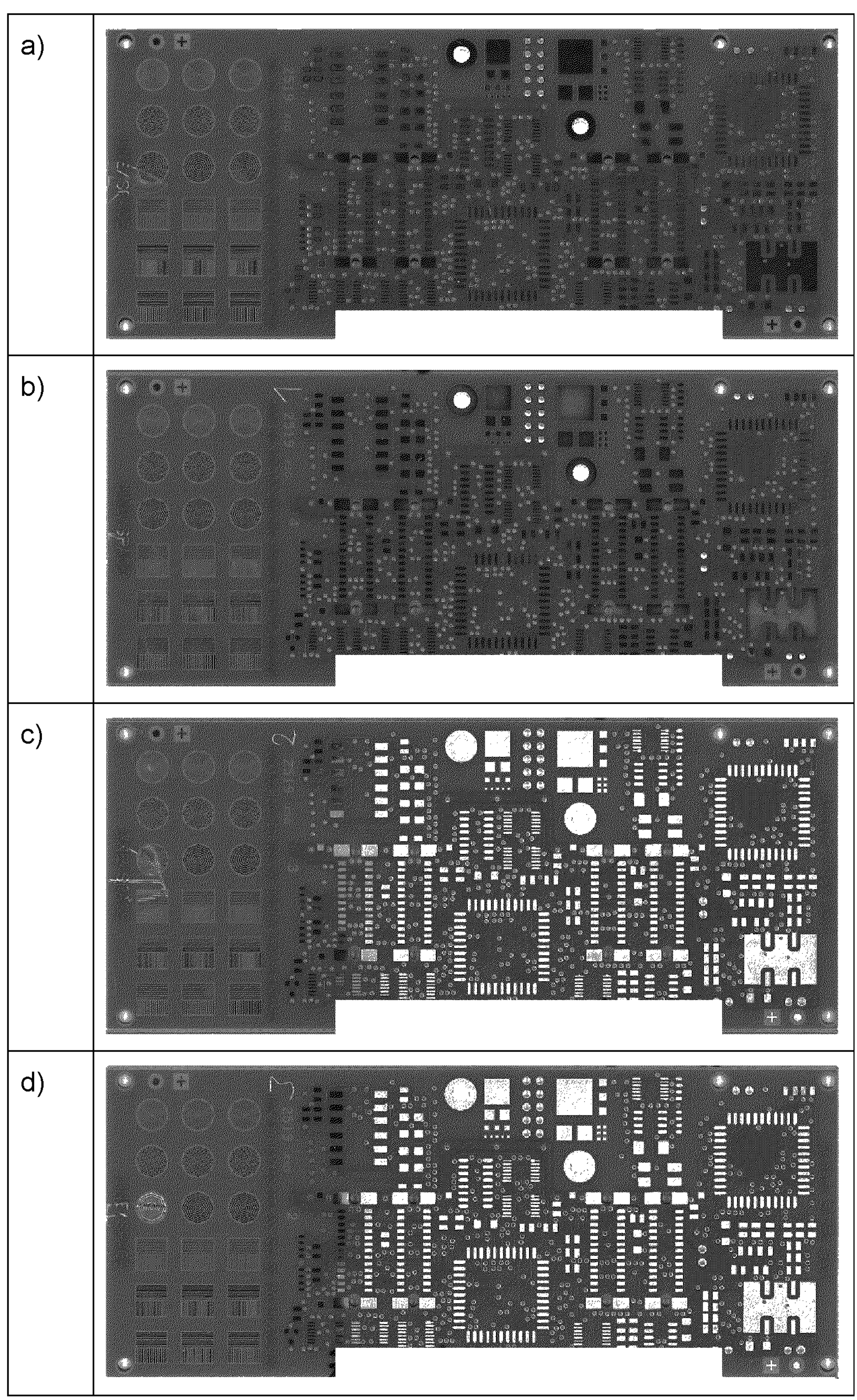
FIG. 2 shows printed circuit boards treated as follows: (a) according to comparative process C-1; (b) according to comparative process C-2; (c) and (d) according to process P with different concentrations of oxidising agent.
Figure 3:
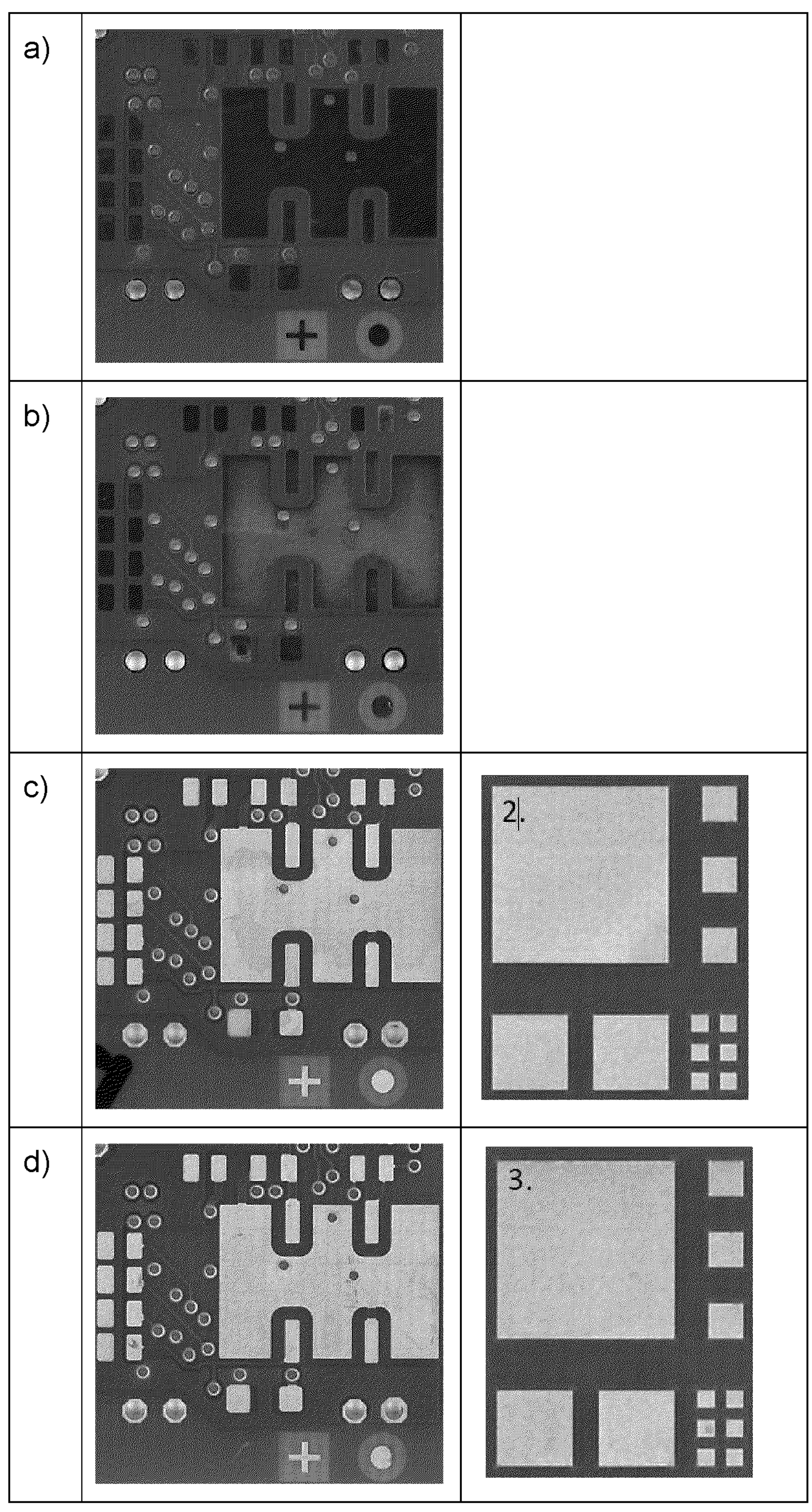
FIG. 3 shows enlargements of the lower right corner of FIG. 2 (middle column) and of the upper middle section of FIG. 2 (right column).: (a) according to comparative process C-1; (b) according to comparative process C-2; (c) and (d) according to process P with different concentrations of oxidising agent.

FIG. 2 shows printed circuit boards treated as follows: (a) according to comparative process C-1; (b) according to comparative process C-2; (c) according to process P with a concentration of 0.3% $H_2O_2$ (post-dip) and (d) according to process P with a concentration of 1.0% $H_2O_2$ (post-dip). FIG. 3 shows respective enlargements of the lower right corner of FIG. 2 (middle column) and of the upper middle section of FIG. 2 (right column).

The results are shown in FIG. 2/FIG. 3 and in Table 2

| Sample | Process | Ionix | Post dip | Shininess |
|---|---|---|---|---|
| (a) | C-1 | — | — | All |
| (b) | C-2 | Yes | — | Almost shiny |
| (c) | P | Yes | Yes (0.3% $H_2O_2$) | No |
| (d) | P | Yes | Yes (1.0% $H_2O_2$) | no |

Example 3

Printed circuit boards with solder resist mask (Taiyo PSR-4000 AM03TS) were treated with a tin deposition method according to Table 1 and a layer of immersion tin of 1 μm thick was applied. The tin deposition bath contained tin (II) methanesulfonate, methane sulfonic acid and thiourea.

The treatment was performed involving the different combinations of

Aging/non-aging;

In the Post Dip step of Table 1: Applying/non-applying PD2020, i.e. the oxidation step (iii) of process P;

In the Post Dip step of Table 1: Applying/non-applying PD270, an already established process for refining the tin surface.

The different combinations can be depicted as follows:

a) Ionix–rinse–no post-dip (=Table 1, process C-2)

b) Ionix–rinse–post-dip PD270–rinse (=Table 1, process C-2 with an inserted post-dip step different from the inventive post dip step)

c) Ionix–rinse–post-dip PD2020–rinse (=Table 1, process P)

d) Ionix–rinse–post-dip 270–rinse–post-dip PD2020-rinse (=Table 1, process P with an inserted post-dip step different from the inventive post dip step prior to the inventive post dip step)

Figure 4:
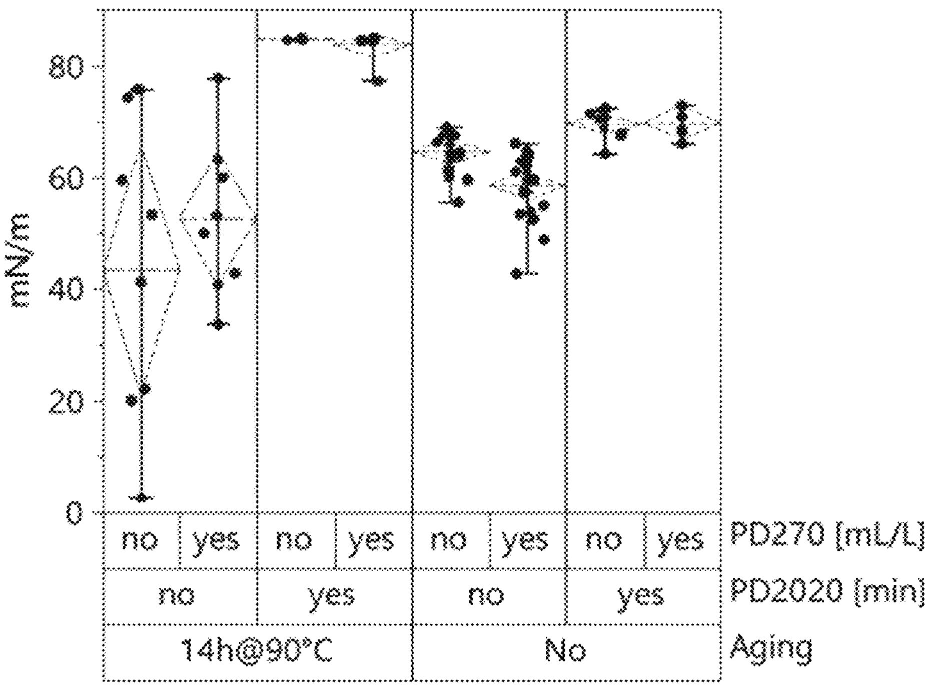
FIG. 4 shows surface tensions measurements of tin oxide layers of printed circuit boards prepared under different conditions, i.e. with and without aging; with and without involving an oxidation step (iii); with and without another post dip step different from oxidation step (iii).

The surface tension of the tin oxide layers of the PCBs has been measured. The results are shown in FIG. 4.

Metal and metal oxides show high surface tensions, while organic substances tend to show lower surface tension. In particular, surfactants have very low surface tension values. Hence, it is favorable to achieve and maintain high surface tensions.

The measurements show that chemical oxidation of the printed circuit boards not only has a positive effect on the formation of the tin oxide layer, but also increases the chemical purity of the surface by reducing the risk of organic substances migrating to the tin surface/tin oxide surface during storage and thereby contaminating it. This migration can occur during storage or transport from PCB factory to assembler, as well as within the assembly process itself.

It is understood that the examples and embodiments described herein are for illustrative purpose only and that various modifications and changes in light thereof as well as combinations of features described in this application will be suggested to persons skilled in the art and are to be included within the spirit and purview of the described invention and within the scope of the appended claims. All publications, patents and patent applications cited herein are hereby incorporated by reference.

The invention claimed is:

1. A process for treating a tin or tin alloy layer onto metal surfaces, comprising the steps of (i) providing a metal surface, wherein the metal surface is a circuit carrier metal surface, (ii) contacting the metal surface, with a tin or tin alloy plating bath; and (iii) oxidizing the tin or tin alloy layer obtained by step (ii), wherein step (iii) is performed by contacting the tin or tin alloy layer obtained by step (ii) with a composition comprising at least one solvent and at least one oxidizing agent, and wherein the composition does not comprise ionic species.

2. The process according to claim 1 wherein the tin or tin alloy plating bath is an immersion plating bath.

3. The process according to claim 1 wherein the composition additionally comprises at least one stabilizing agent.

4. The process according to claim 1 wherein the at least one oxidizing agent is selected from non-decomposable and decomposable oxidizing agents.

5. The process according to claim 4 wherein the at least one oxidizing agent is selected from decomposable oxidizing agents.

6. The process according to claim 1, wherein the concentration of the at least one oxidizing agent in the composition ranges from about 0.1 to about 20 g/l.

7. The process according to claim 1, wherein the pH of the composition ranges from about 3 to about 12.

8. The process according to claim 1, wherein dwell time of the contacting in step (iii) is from about 0.1 min to about 5 min.

9. The process according to claim 1, wherein the temperature in step (iii) is higher than 40° C.

10. The process according to claim 1, carried out in a process of production of electric circuit carriers in vertical and/or horizontal lines.

11. The process according to claim 1, carried out in a process of production of electric contacts on electric circuit carriers.

12. The process according to claim 1, wherein the process further comprises rinsing the tin or tin alloy layer at least once with deionized water before and/or after step (iii).

13. The process according to claim 1, wherein the process further comprises a step (ii-a) between step (ii) and step (iii), wherein step (ii-a) comprises treating the tin or tin alloy layer with an aqueous solution, the solution containing:

a) at least one first compound selected from ethanolamine compounds and the salts thereof;

b) at least one second compound selected alcoholic solvents, and c) optionally, at least one third compound selected from guanidine compounds and salts thereof.

14. The process according to claim 1 wherein the metal surface comprises a copper surface.

15. The process according to claim 1 wherein the composition of step (iii) comprises:

(a) at least one solvent;

(b) at least one oxidizing agent, (c) optionally, at least one stabilizing agent, and (d) optionally, at least one pH adjusting compound;

wherein preferred the at least one solvent comprises water, wherein the at least one oxidizing agent is selected from non-decomposable and decomposable oxidizing agents, and wherein the at least one pH adjusting compound, when present, is selected from non ionic compounds.

16. The process according to claim 15 wherein the at least one stabilizing agent is present.

17. The process according to claim 15 wherein the composition comprises at least one pH adjusting compound.

* * * * *